US009065468B2

(12) United States Patent
Tojo et al.

(10) Patent No.: US 9,065,468 B2
(45) Date of Patent: Jun. 23, 2015

(54) ENCODER SIGNAL PROCESSING CIRCUIT

(71) Applicant: OLYMPUS CORPORATION, Tokyo (JP)

(72) Inventors: Ryo Tojo, Hachioji (JP); Aiko Sakai, Higashimurayama (JP)

(73) Assignee: OLYMPUS CORPORATION, Tokyo (JP)

(*) Notice: Subject to any disclaimer, the term of this patent is extended or adjusted under 35 U.S.C. 154(b) by 159 days.

(21) Appl. No.: 13/781,987

(22) Filed: Mar. 1, 2013

(65) Prior Publication Data

US 2013/0176149 A1 Jul. 11, 2013

Related U.S. Application Data

(63) Continuation of application No. PCT/JP2011/069605, filed on Aug. 30, 2011.

(30) Foreign Application Priority Data

Sep. 3, 2010 (JP) .................................. 2010-198103

(51) Int. Cl.
*H03M 1/22* (2006.01)
*G01D 5/244* (2006.01)

(52) U.S. Cl.
CPC ............. *H03M 1/22* (2013.01); *G01D 5/24461* (2013.01)

(58) Field of Classification Search
CPC .............. H03M 1/22; H03M 13/2957; H03M 13/1105; H03M 2201/2174; G01D 5/24461
USPC ....................................................... 341/6, 13
See application file for complete search history.

(56) References Cited

U.S. PATENT DOCUMENTS 7,369,063 B2 * 5/2008 Masaki .............................. 341/6

FOREIGN PATENT DOCUMENTS

| JP | 60-218027 A | 10/1985 |
|---|---|---|
| JP | 5-272988 A | 10/1993 |
| JP | 7-139967 A | 6/1995 |
| JP | 8-233599 A | 9/1996 |
| JP | 10-48235 A | 2/1998 |
| JP | 10-333826 A | 12/1998 |
| JP | 11-2515 A | 1/1999 |
| JP | 2000-148225 A | 5/2000 |
| JP | 2002-24979 A | 1/2002 |
| JP | 2006-177913 A | 7/2006 |
| JP | 2008-122264 A | 5/2008 |

OTHER PUBLICATIONS

International Preliminary Report on Patentability together with the Written Opinion dated Apr. 18, 2013 received in related International Application No. PCT/JP2011/069605.
International Search Report dated Dec. 6, 2011 issued in PCT/JP2011/069605.
Notice of Reasons for Rejection dated Mar. 4, 2014 from corresponding Japanese Application No. 2010-198103, together with an English language translation.
Japanese Office Action dated Nov. 11, 2014 from related Japanese Application No. 2010-198103, together with an English language translation.

* cited by examiner

*Primary Examiner* — Jean B Jeanglaude
(74) *Attorney, Agent, or Firm* — Scully, Scott, Murphy & Presser, P.C.

(57) ABSTRACT

An encoder signal processing circuit is connected to encoder heads outputting an encoder signal in accordance with a relative displacement with respect to a corresponding scale in such a way that signals can be transmitted to and received from the encoder heads, and processes encoder signals from the encoder heads. The circuit includes a processing unit and a processing decision unit. The processing unit generates displacement information from the encoder signal. The processing decision unit decides at least one of content of processing for the encoder heads and content of processing on encoder signals read from the encoder heads after starting to read an encoder signal from one of the encoder heads.

8 Claims, 10 Drawing Sheets

| Processing order | Order of priority: encoder signal A>encoder signal B |||||| |
|---|---|---|---|---|---|---|---|
| | Encoder signal A | Encoder signal A | Encoder signal B | Encoder signal A | Encoder signal A | Encoder signal B | ... |
F I G. 15
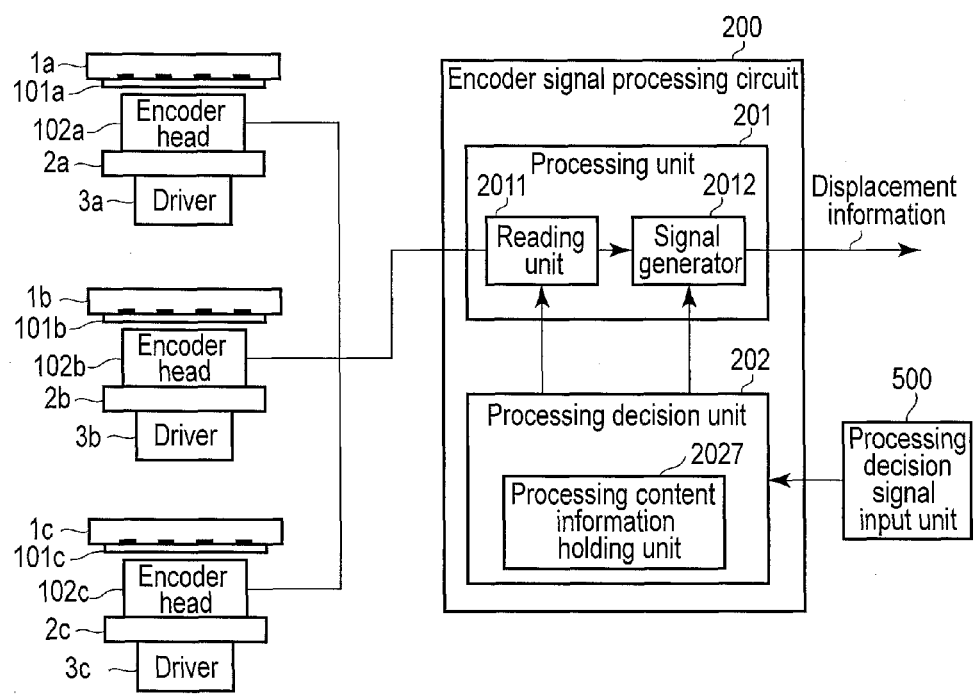
F I G. 16

ENCODER SIGNAL PROCESSING CIRCUIT

CROSS REFERENCE TO RELATED APPLICATIONS

This application is a Continuation application of PCT Application No. PCT/JP2011/069605, filed Aug. 30, 2011 and based upon and claiming the benefit of priority from prior Japanese Patent Application No. 2010-198103, filed Sep. 3, 2010, the entire contents of all of which are incorporated herein by reference.

BACKGROUND OF THE INVENTION

1. Field of the Invention

The present invention relates to an encoder signal processing circuit that processes signals from a plurality of encoder heads.

2. Description of the Related Art

An encoder is configured to generate analog periodic signals (encoder signal) of at least two mutually different phases in accordance with displacement of a movable body. Generally, an encoder includes a scale mounted on a fixed body and an encoder head provided on a movable body arranged opposite to the scale to output an encoder signal accompanying changes in relative position with respect to the scale. Such an encoder processes an encoder signal output from the encoder head by an encoder signal processing circuit. Accordingly, the traveling direction, position, displacement, speed and the like of a movable body can be measured.

In recent years, encoder signal processing circuits configured to process encoder signals from a plurality of encoder heads by a single encoder signal processing circuit is proposed by, for example, Jpn. Pat. Appln. KOKAI Publication No. 7-139967.

The encoder signal processing circuit proposed by Jpn. Pat. Appln. KOKAI Publication No. 7-139967 is configured to successively input encoder signals from a plurality of encoder heads into the encoder signal processing circuit to acquire all encoder signals from respective encoder heads in the same sample holding period so that the encoder signals from the respective encoder heads are detected within the periods which are considered the same periods. In this case, if the number of encoder heads increases, the time needed to complete processing on all encoder signals increases correspondingly. Therefore, to process a plurality of encoder signals in a short time by using the configuration of Jpn. Pat. Appln. KOKAI Publication No. 7-139967, ICs and the like used as an encoder signal processing circuit need to be capable of faster processing in accordance with an increase in the number of encoder heads.

The present invention is made in view of the above circumstances and an object thereof is to provide an encoder signal processing circuit capable of efficiently processing encoder signals output from a plurality of encoder heads by a single processing circuit.

BRIEF SUMMARY OF THE INVENTION

According to a first aspect, an encoder signal processing circuit, connected to a plurality of encoder heads outputting an encoder signal in accordance with a relative displacement with respect to a corresponding scale in such a way that the signal can be transmitted/received and which processes the respective encoder signal from the plurality of encoder heads, comprises a processing unit that generates displacement information from the encoder signal and a processing decision unit that decides at least one of content of processing for the plurality of encoder heads and content of processing on the encoder signal read from the plurality of encoder heads after starting to read the encoder signal from one of the plurality of encoder heads.

According to a second aspect, an encoder signal processing circuit, that processes an encoder signal from each of a plurality of encoder heads, each of which outputs the encoder signal in accordance with a relative displacement with respect to a corresponding scale, comprises a processing unit that generates displacement information from the encoder signal and a processing decision unit that decides at least one of content of processing for the encoder heads and content of processing on the encoder signal read from the encoder heads before reading the encoder signal from one of the encoder heads.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 15 is a diagram illustrating a modification when the order of processing and the number of times of processing of encoder signals are decided according to the order of priority of processing of the encoder signals.

FIG. 16 is a diagram showing a modification when a user is enabled to set a combination of encoder heads and signal processing content.

DETAILED DESCRIPTION OF THE INVENTION

The embodiments of the present invention will be descried below with reference to the drawings.

[First Embodiment]

Figure 1:
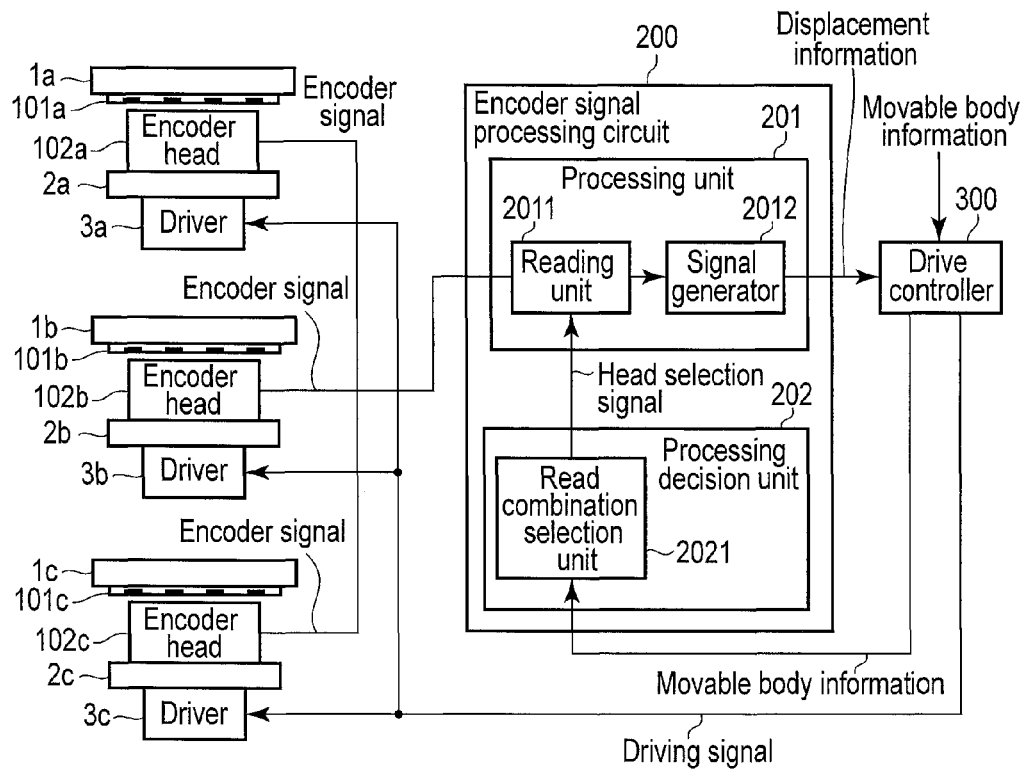
FIG. 1 is a diagram showing the configuration of an encoder system containing an encoder signal processing circuit according to a first embodiment of the present invention.

The first embodiment of the present invention will be described. FIG. 1 is a diagram showing the configuration of an encoder system containing an encoder signal processing circuit according to the first embodiment of the present invention. The encoder system in the present embodiment includes a plurality of sets of a scale and an encoder head. The encoder system is configured to process an encoder signal output from each encoder head by using a single encoder signal processing circuit.

The encoder system shown in FIG. 1 includes a plurality (three in the example in FIG. 1) of fixed bodies 1a, 1b, and 1c. A scale 101a is mounted on the fixed body 1a. Similarly, a scale 101b is mounted on the fixed body 1b and a scale 101c is mounted on the fixed body 1c. The scales 101a, 101b, and 101c each have displacement detection patterns formed in predetermined periods.

The encoder system shown in FIG. 1 also has a plurality of movable bodies 2a, 2b, and 2c arranged opposite to the respective fixed bodies 1a, 1b, and 1c. The movable bodies 2a, 2b, and 2c are configured freely, relatively displaced with respect to the corresponding fixed bodies.

A driver 3a is mounted on the movable body 2a. Similarly, a driver 3b is mounted on the movable body 2b and a driver 3c is mounted on the movable body 2c. The drivers 3a, 3b, and 3c each have driving mechanisms such as motors and displace the movable bodies 2a, 2b, and 2c in a predetermined displacement direction according to a driving signal from a drive controller 300.

An encoder head 102a is mounted on the movable body 2a. Similarly, an encoder head 102b is mounted on the movable body 2b and an encoder head 102c is mounted on the movable body 2c. The encoder heads 102a, 102b, and 102c are displaced accompanying displacements of the movable bodies 2a, 2b, and 2c respectively and output encoder signal in accordance with displacements relative to the corresponding scales to an encoder signal processing circuit 200.

In the example in FIG. 1, the scales 101a, 101b, and 101c are mounted on the fixed bodies 1a, 1b, and 1c and the encoder heads 102a, 102b, and 102c are mounted on the movable bodies 2a, 2b, and 2c. Conversely, the scales 101a, 101b, and 101c may be configured to be mounted on the movable bodies 2a, 2b, and 2c and the encoder heads 102a, 102b, and 102c may be configured to be mounted on the fixed bodies 1a, 1b, and 1c. Displacement directions of the movable bodies 2a, 2b, and 2c may be different or the same.

Figure 2:
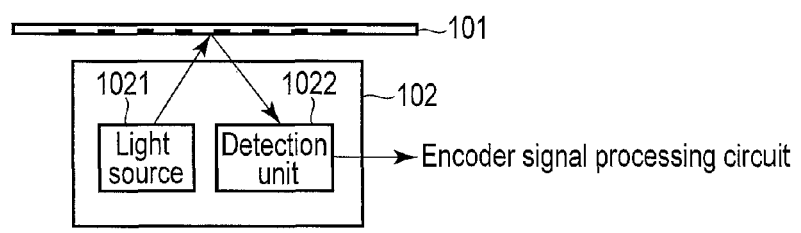
FIG. 2 is a diagram showing an internal configuration of an encoder head.

FIG. 2 is a diagram showing an internal configuration of one encoder head 102 of the encoder heads 102a, 102b, and 102c. FIG. 2 shows an example of the encoder head of a reflection-type optical encoder. The encoder head 102 shown in FIG. 2 includes a light source 1021 and a detection unit 1022. The light source 1021 irradiates a scale 101 provided opposite to the light source 1021 with a light beam having coherence. The detection unit 1022 includes photodiodes for four phases that generate analog periodic signals (encoder signal) of four phases having phase differences of 90 degrees with each other. The detection unit 1022 receives patterns projected from the scale 101 by a light beam emitted from the light source 1021 by respective photodiodes for four phases and generates encoder signal in proportion to the amount of light of the patterns received by the respective photodiodes.

The encoder signal processing circuit 200 includes a processing unit 201 and a processing decision unit 202. The encoder heads 102a, 102b, and 102c are connected to the encoder signal processing circuit 200 by a shared wire. Encoder signals are input into the processing unit 201 from the encoder heads 102a, 102b, and 102c when appropriate.

The processing unit 201 includes a reading unit 2011 and a signal generator 2012.

The reading unit 2011 reads encoder signals from encoder heads in a combination according to a head selection signal from a read combination selection unit 2021 of the processing decision unit 202 and outputs the encoder signals to the signal generator 2012. The signal generator 2012 processes the encoder signal input from the reading unit 2011 to calculate a relative displacement between a scale and an encoder head and outputs the calculated relative displacement to the drive controller 300 as displacement information. Various methods, such as the resistance division method, tangent method, and ROM reference method are known as methods to calculate relative displacement. In the present embodiment, the calculation method of relative displacement is not specifically limited and any method may be used.

The processing decision unit 202 includes the read combination selection unit 2021. The read combination selection unit 2021 generates a head selection signal according to movable body information from the drive controller 300 and inputs the head selection signal into the reading unit 2011. In the present embodiment, the user of an encoder system can select and decide a combination of movable bodies to be used when the encoder system is operating. If an unused movable body is present, there is no need to read an encoder signal from the encoder head corresponding to the movable body. In such a case, a message indicating that there is no need to read an encoder signal corresponding to an unused movable body is input into the reading unit 2011 as a head selection signal. Upon receipt of the head selection signal, the reading unit 2011 avoids reading an encoder signal from the encoder head corresponding to the unused movable body.

The drive controller 300 controls the operation of the drivers 3a, 3b, and 3c according to displacement information input from the signal generator 2012 of the encoder signal processing circuit 200. The drive controller 300 changes the magnitude or polarity of a driving signal supplied to the corresponding driver so that displacement information (or rate information calculated as changes in time of displacement information) input from the encoder signal processing circuit 200 accompanying relative displacements of the movable bodies 2a, 2b, and 2c becomes a desired value. By changing the magnitude of the driving signal, the magnitude of the displacement rate of the movable body driven by the corresponding driver changes. By changing the polarity of the driving signal, on the other hand, the direction of the displacement rate of the movable body driven by the corresponding driver changes.

Figure 3:
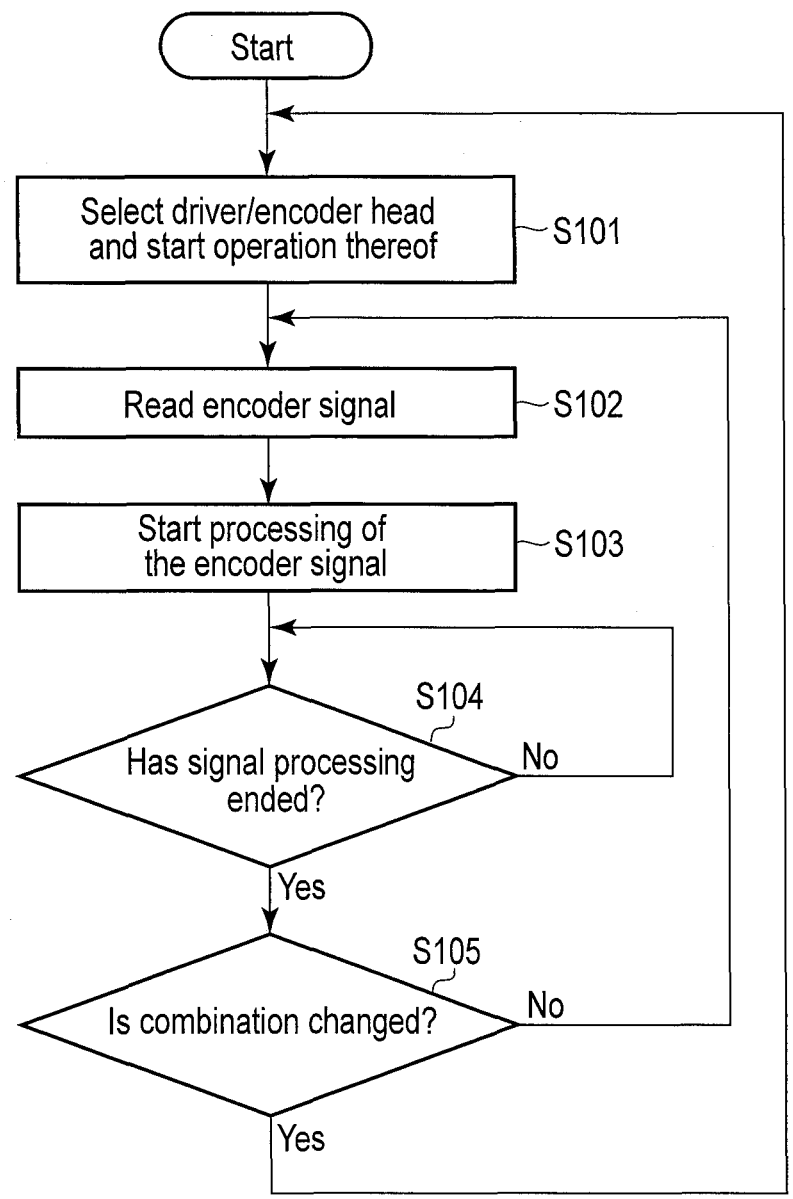
FIG. 3 is a flow chart showing the flow of operation of the encoder system in the first embodiment of the present invention.

The operation of an encoder system in the present embodiment will be described below. FIG. 3 is a flow chart showing the flow of operation of the encoder system in the first embodiment.

Before starting the operation of the encoder system, the movable body to be used is selected. Movable bodies may be manually selected by the user or automatically selected by the drive controller 300. When, for example, movable bodies are manually selected, the user operates an operation unit (not shown) to specify a combination of movable bodies to be used. When movable bodies are selected, information about the combination of the selected movable bodies (movable body information) is input into the drive controller 300. Upon receipt of the movable body information, the drive controller 300 supplies a driving signal to the drivers corresponding to the movable bodies identified based on the movable body information to start the operation of the drivers. The drive controller 300 also turns on power supplies of the corresponding encoder heads (step S101).

After the operations of the drivers and encoder heads are started, the reading unit 2011 reads an encoder signal from one of the encoder heads in the combination according to a head selection signal from the read combination selection unit 2021. The reading unit 2011 converts the read signal into a digital signal and outputs the digital signal to the signal generator 2012 (step S102). The order of reading encoder signals in step S102 is assumed to be, for example, the order of the encoder heads 102a, 102b, and 102c, but is not limited to the above order. Encoder signals from respective encoder heads may be read at the same time. In such a case, respective read encoder signals are held in the reading unit 2011.

Upon receipt of input of the encoder signal, the signal generator 2012 processes the input encoder signal to start the calculation of displacement information (step S103). When calculating displacement information, the signal generator 2012 removes offset components or noise components in encoder signals detected by the detection unit 1022 by calculating a difference of signals, among signals of four phases having phase differences of 90 degrees with each other, having a phase difference of 180 degrees. After calculating the difference, the signal generator 2012 calculates displacement information by using signals of two phases having a phase difference of 90 degrees obtained by the difference calculation. Various methods described above, such as the resistance division method, tangent method, and ROM reference method can be used to determine displacement information. In the ROM reference method, for example, changes in time of phase positions (angle information) of respective encoder signals identified by the amplitude (AD converted value) of encoder signals of two phases, that is, a difference between angle information based on an encoder signal from an encoder head and angle information based on an encoder signal acquired last time from the same encoder head is calculated as a relative displacement. The last angle information is updated for each encoder head each time phase difference information is calculated. If, for example, phase difference information about the encoder head 102a is determined, the last angle information about the encoder head 102a is updated and the last angle information about the encoder head 102b or 102c is not updated.

After signal processing is started, the drive controller 300 determines whether the signal processing has ended, that is, whether displacement information is input from the signal generator 2012 (step S104). The drive controller 300 continues the determination in step S104 until the signal processing ends in step S104. When the signal processing is determined to have ended in step S104, the drive controller 300 determines whether the combination of movable bodies to be used has been changed (step S105). If, for example, a new combination of movable bodies is specified by the user during signal processing, the drive controller 300 determines that the combination of movable bodies to be used has been changed. If the combination of movable bodies to be used is determined not to have changed in step S105, the drive controller 300 controls the magnitude or polarity of a driving signal supplied to the driver based on displacement information input from the signal generator 2012 so that the amount of displacement of the corresponding movable body becomes a desired value. Then, the processing returns to step S102. In this case, the reading unit 2011 reads the next encoder signal and outputs the encoder signal to the signal generator 2012. If the combination of movable bodies to be used is determined to have changed in step S105, the drive controller 300 controls the magnitude or polarity of a driving signal supplied to the driver based on displacement information that has been input from the signal generator 2012 so that the amount of displacement of the corresponding movable body becomes a desired value. Then, the processing returns to step S101. In this case, the drive controller 300 selects the combination of drivers again.

In the first embodiment, as has been described above, encoder signals from encoder heads corresponding to the selected movable bodies are read. Accordingly, when encoder signals from a plurality of encoder heads are processed by the single encoder signal processing circuit 200, the processing load on the signal generator 2012 can be reduced when compared with a case when encoder signals from all encoder heads are read in accordance with conditions during operation of the encoders. Moreover, the number of encoder signals needed for processing can be reduced, and thus the reading interval of encoder signals from individual encoder heads can be shortened. Accordingly, each shorter displacement can be detected, which enables displacement detection with higher precision.

Even if the number of encoders configuring an encoder system is increased or decreased, there is almost no need to change the configuration of the encoder signal processing circuit 200. Thus, a versatile encoder signal processing circuit that can be applied to various encoder systems can be provided.

Further, optimal processing in accordance with conditions is enabled by making the combination of movable bodies (that is, the combination of drivers and encoder heads) changeable during signal processing by the signal generator 2012.

FIG. 1 illustrates an application example of the present embodiment to a reflection-type optical encoder. The technology of the present embodiment may also be applied to a transmission-type optical encoder or to an encoder other than the optical encoder such as a magnetic or capacitive encoder. Further, the scale shown in FIG. 1 shows an example of the linear scale and the encoder system shown in FIG. 1 detects a displacement of length by using the linear scale. In contrast, a circular scale may be adopted as a scale to detect changes in angle.

Also in the first embodiment, encoder signals are signals of four phases having phase differences of 90 degrees with each other. However, encoder signals do not necessarily have to have phase differences of 90 degrees with each other. Any number of signals having any phase differences may be output.

Further, in the first embodiment, an encoder signal is converted into a digital signal by the reading unit 2011. However, an encoder signal may be converted into a digital signal inside the encoder head. In this case, an encoder signal can be output as a digital signal from the encoder head, and thus the encoder signal becomes less susceptible to noise on the communication path up to the encoder signal processing circuit 200. Therefore, the possibility of erroneous detection of displacement information can further be reduced.

Also in the first embodiment, encoder signals are read only from encoder heads corresponding to the selected movable bodies, but encoder signals may be read by operating all heads.

[Second Embodiment]

Figure 4:
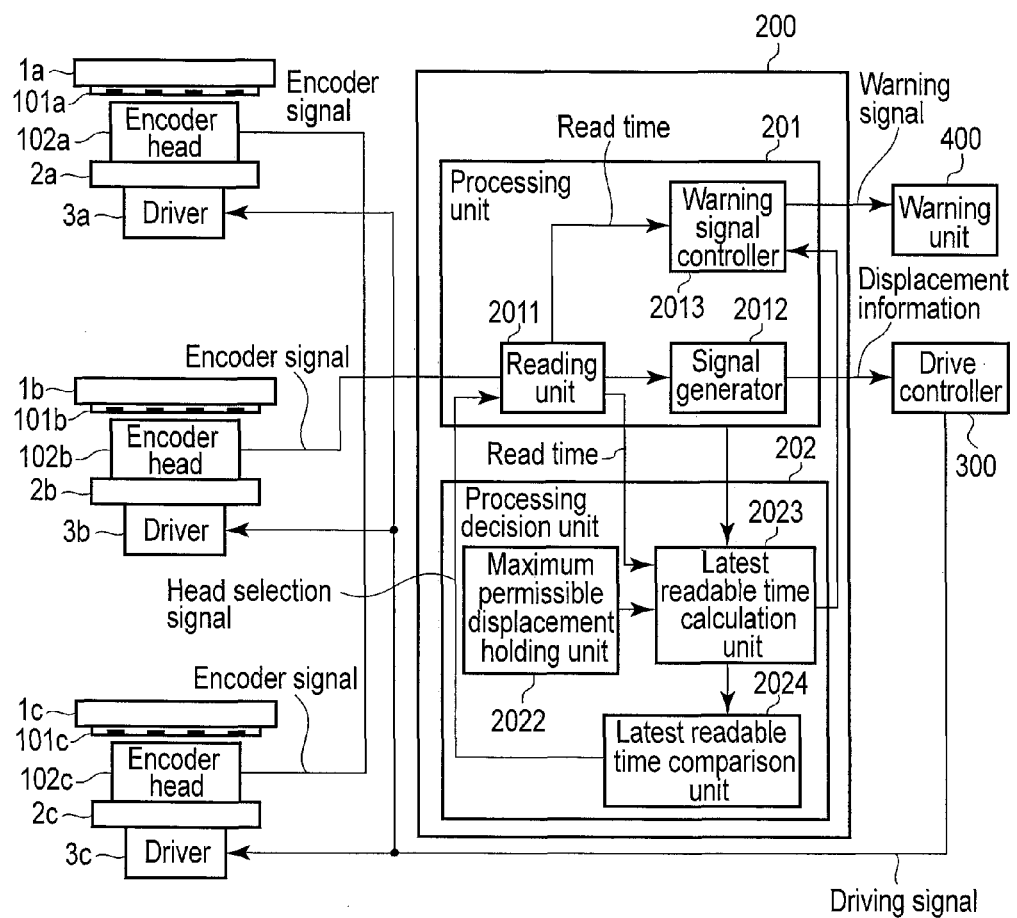
FIG. 4 is a diagram showing the configuration of an encoder system containing an encoder signal processing circuit according to a second embodiment of the present invention.

Next, the second embodiment of the present invention will be described. FIG. 4 is a diagram showing the configuration of an encoder system containing an encoder signal processing circuit according to the second embodiment of the present invention.

The encoder system in the present embodiment includes, as in the first embodiment, a plurality of sets of a scale and an encoder head and is configured to process an encoder signal output from each encoder head by using a single encoder signal processing circuit. In the present embodiment, the encoder signal is a periodic signal. The present embodiment is different from the first embodiment particularly in the internal configuration of encoder signal processing circuit 200. The present embodiment is also different in that an encoder system in the present embodiment includes a warning unit 400.

Different portions from the first embodiment will be described below. The encoder signal processing circuit 200 in the present embodiment includes, like the first embodiment, a processing unit 201 and a processing decision unit 202.

The processing decision unit 202 includes, as shown in FIG. 4, a maximum permissible displacement holding unit 2022, a latest readable time calculation unit 2023, and a latest readable time comparison unit 2024. FIG. 4 shows an example in which a read combination selection unit 2021 is omitted, but the read combination selection unit 2021 may also be provided.

Because the encoder signal in the present embodiment is a periodic signal, erroneous detection of displacement information occurs if an encoder signal exceeds a fixed period between continuous read times. The maximum permissible displacement holding unit 2022 is a memory holding the maximum permissible displacement for each encoder head. The maximum permissible displacement is a limit value of relative displacement that allows relative displacement detection by the encoder head to continue between continuous read times of the encoder signal for each encoder head (no erroneous detection of displacement information occurs due to a read skip of the encoder signal). If, for example, the encoder head includes a memory to hold encoder signals, the maximum permissible displacement becomes larger. The maximum permissible displacement also becomes larger if the period of a displacement detection pattern formed on a scale is large. Thus, the maximum permissible displacement changes depending on various conditions and may be different if the encoder head and scale to be used are different.

Thus, the maximum permissible displacement holding unit 2022 is made to hold the maximum permissible displacement for each encoder head.

The latest readable time calculation unit 2023 calculates the latest readable time for each encoder head by using the maximum permissible displacement for each encoder head held in the maximum permissible displacement holding unit 2022 and outputs the calculated latest readable time to the latest readable time comparison unit 2024 and a warning signal controller 2013. The latest readable time is a time when the relative displacement corresponding to a certain encoder head reaches the maximum permissible displacement. When the relative displacement reaches the maximum permissible displacement, a correct phase position (angle information) cannot be calculated for the encoder signal output at that point. As a result, an error occurs in displacement information.

The latest readable time comparison unit 2024 compares latest readable times for each encoder head calculated by the latest readable time calculation unit 2023 to select and decide the reading order of the next encoder signal from encoder heads 102a, 102b, and 102c.

The processing unit 201 in the present embodiment includes, as shown in FIG. 4, a reading unit 2011, a signal generator 2012, and the warning signal controller 2013.

The reading unit 2011 reads encoder signals in the order according to a head selection signal from the latest readable time comparison unit 2024 and outputs the encoder signals to the signal generator 2012. The reading unit 2011 also has a function to measure the time and outputs, each time an encoder signal is read, the time of reading to the latest readable time calculation unit 2023 and the warning signal controller 2013.

The signal generator 2012 processes the encoder signal input from the reading unit 2011 to calculate a relative displacement between a scale 101 and an encoder head 102 and outputs the calculated relative displacement to a drive controller 300 as displacement information. The method of calculating a relative displacement is as used in the first embodiment. The signal generator 2012 in the present embodiment also outputs displacement information to the latest readable time calculation unit 2023.

The warning signal controller 2013 compares the read time of an encoder signal from the reading unit 2011 and the latest readable time from the latest readable time calculation unit 2023. If the read time is past the latest readable time, the relative displacement is considered to exceed the maximum permissible displacement. In this case, it is highly probable that an error has occurred in a calculation result of displacement information. At this point, the warning signal controller 2013 outputs a warning signal to the warning unit 400.

Upon receipt of the warning signal from the warning signal controller 2013, the warning unit 400 gives a warning to the user that the relative displacement between the scale and encoder head may have exceeded the maximum permissible displacement. The method of warning by the warning unit 400 is not specifically limited. If, for example, the warning unit 400 is configured as a monitor or warning lamp, a visual warning can be given. If the warning unit 400 is configured as a buzzer or the like, a warning by sound can be given.

Figure 5:
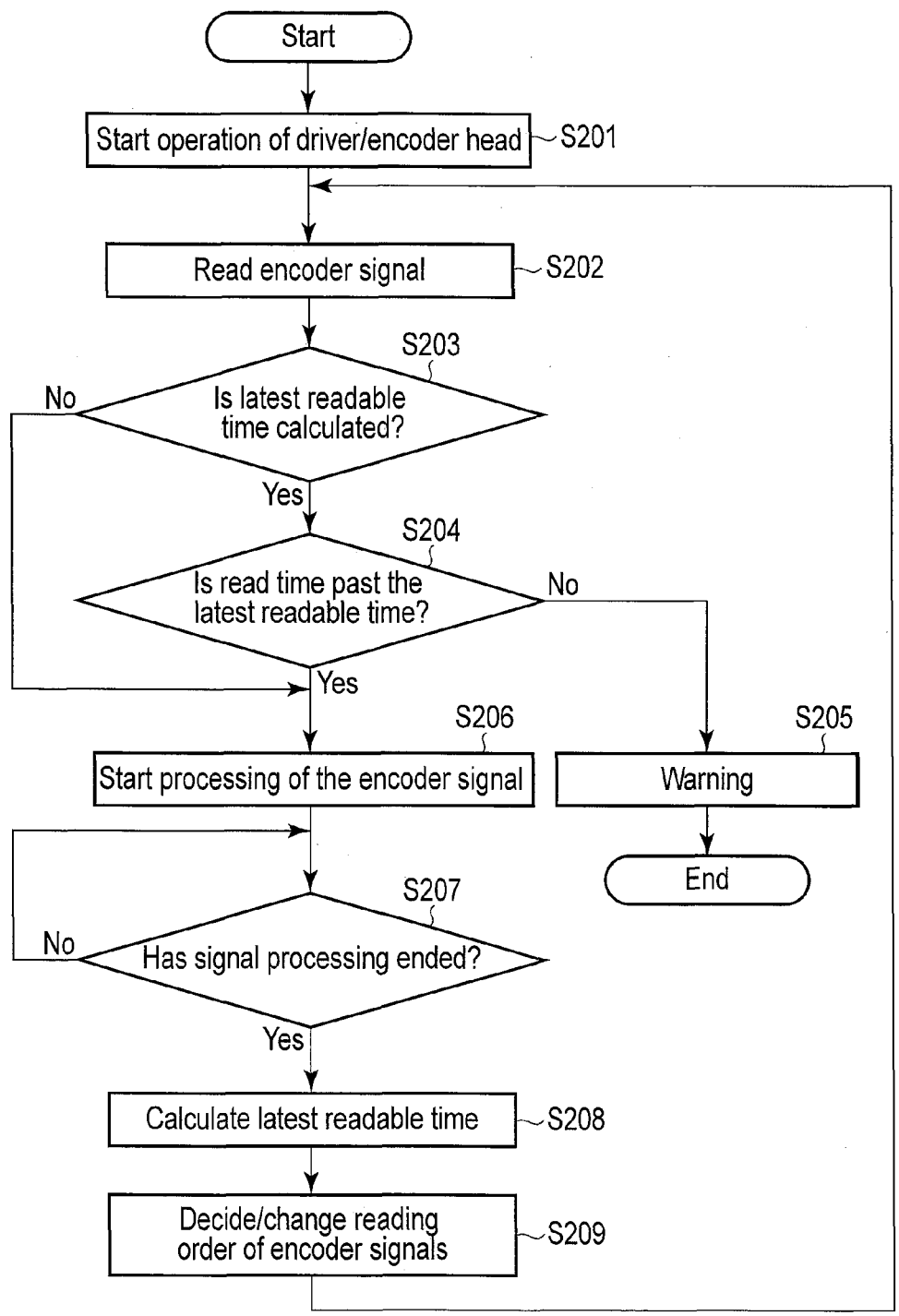
FIG. 5 is a flow chart showing the flow of operation of the encoder system in the second embodiment of the present invention.

The operation of an encoder system in the present embodiment will be described below. FIG. 5 is a flow chart showing the flow of operation of the encoder system in the second embodiment.

In FIG. 5, the drive controller 300 supplies a driving signal to each of drivers 3a, 3b, and 3c to start the operation of the drivers. The drive controller 300 also turns on power supplies of encoder heads (step S201). After the operation of the drivers and encoder heads is started, the reading unit 2011 reads an encoder signal from one of the encoder heads 102a, 102b, and 102c in the order according to a head selection signal from the latest readable time comparison unit 2024 and outputs the encoder signal to the signal generator 2012 (step S202). Initially, the reading order is not yet decided by the latest readable time comparison unit 2024, and thus the reading order of encoder signals is assumed to be a fixed order. When an encoder signal is read, as described above, the reading unit 2011 outputs the read time of the encoder signal to the latest readable time calculation unit 2023 and the warning signal controller 2013. The read time input into the latest readable time calculation unit 2023 is successively held in the latest readable time calculation unit 2023.

The signal generator 2012 determines whether the latest readable time has been calculated by the latest readable time calculation unit 2023 (step S203). If, in step S203, the signal generator 2012 determines that no latest readable time is calculated, as in after initially starting the encoder operation, the processing proceeds to step S206. If, in step S203, the signal generator 2012 determines that the latest readable time has been calculated, the warning signal controller 2013 compares the read time input from the reading unit 2011 and the latest readable time calculated by the latest readable time calculation unit 2023 to determine whether the read time is past the latest readable time (step S204). If, in step S204, the warning signal controller 2013 determines that the read time is past the latest readable time, an occurrence of an error in displacement information calculated based on an encoder signal from the corresponding encoder head can be considered. Therefore, the warning signal controller 2013 inputs a warning signal into the warning unit 400 so that a warning is given by the warning unit 400 (step S205). Then, the drive controller 300 stops the supply of a driving signal to the drivers 3a, 3b, and 3c. Accordingly, the processing in FIG. 5 ends. In the example in FIG. 5, the subsequent operation of the drivers 3a, 3b, and 3c is stopped when the read time is past the latest readable time. In contrast, the operation of the drivers 3a, 3b, and 3c may not be stopped while giving only a warning.

If, in step S204, the warning signal controller 2013 determines that the read time is not past the latest readable time, the signal generator 2012 processes the input encoder signal to start the calculation of displacement information (step S206). The method of calculating displacement information is the same as in the first embodiment, and thus the description thereof is omitted. After signal processing is started, the signal generator 2012 determines whether the signal processing has ended (step S207). The signal generator 2012 continues the determination in step S207 until the signal processing ends in step S207. If, in step S207, the signal generator 2012 determines that the signal processing has ended, the latest readable time calculation unit 2023 calculates the latest readable time for each encoder head (step S208). Then, the latest readable time comparison unit 2024 decides the reading order of encoder signals by comparing the latest readable times for each encoder head (step S209).

Figure 6:
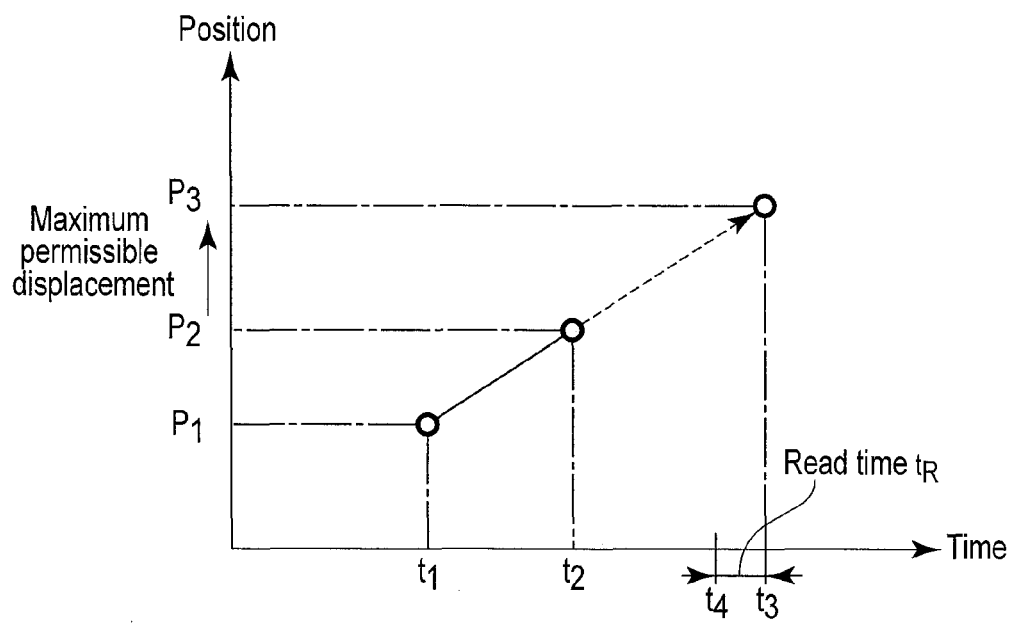
FIG. 6 is a diagram illustrating a calculation method of the latest readable time.

The method of calculating the latest readable time and the method of deciding the reading order of encoder signals will be described with reference to FIG. 6. For the calculation of the latest readable time, the latest readable time calculation unit 2023 reads the maximum permissible displacement for each encoder head from the maximum permissible displacement holding unit 2022 to calculate the latest readable time by using the read maximum permissible displacement, the read time input from the reading unit 2011, and the displacement information input from the signal generator 2012. First, a relative speed v (corresponding to the inclination of the line segment shown in FIG. 6) is calculated according to (Formula 1) below from a read time $t_1$ of the last encoder signal, a relative displacement $p_1$ calculated last time, a read time $t_2$ of the encoder signal this time, and a relative displacement $p_2$ calculated this time.

$$v=(p_2-p_1)/(t_2-t_1) \quad \text{(Formula 1)}$$

If, at this point, $t_2-t_1$, which is the elapsed time from $t_1$ to $t_2$, is known, each of the read times $t_1$, $t_2$ may not be known. The time may also be the count of an electric clock or the like.

The displacement obtained from $p_2$ by adding the maximum permissible displacement is set as $p_3$. If a time $t_3$ when the displacement reaches $p_3$ by assuming that, for example, the relative speed of the scale and encoder head does not change, $t_3$ is represented by (Formula 2) below:

$$t_3=t_2+(p_3-p_2)/v \quad \text{(Formula 2)}$$

Further, if the time of $t_R$ is needed for the reading unit 2011 to read an encoder signal from the encoder head, a latest readable time $t_4$ is represented by (Formula 3) below:

$$t_4=t_3-t_R \quad \text{(Formula 3)}$$

If reading of encoder signals is started before the latest readable time $t_4$ represented by (Formula 2), (Formula 3), no read skip of encoder signals output from the encoder head will occur. In this case, angle information can correctly be determined and no error in displacement information occurs. Therefore, if encoder signals are read from encoder heads in chronological order of the latest readable time, the possibility of an error occurrence in displacement information can be reduced. Based on the above idea, the latest readable time comparison unit 2024 compares the latest readable times calculated for each encoder head to decide the reading order of encoder signals in chronological order of the latest readable time.

In the above calculation method of the latest readable time, an example of determining $t_3$ by assuming that the relative speed of the scale and encoder head does not change is shown. In addition, other methods, such as determining $t_3$ as $t_3=t_2+(p_3-p_2)/v_m$ from a limit value $v_m$ of the driving speed of the driver, may also be used.

After the latest readable time is calculated, the latest readable time comparison unit 2024 outputs a head selection signal to the reading unit 2011 to change the reading order of encoder signals (step S209). Then, the processing returns to step S202. In this case, the reading unit 2011 reads the next encoder signal and outputs the encoder signal to the signal generator 2012.

In the second embodiment, as described above, the latest readable time for each encoder head is calculated after reading of encoder signals is started and the reading order of encoder signals is decided according to the latest readable time. Accordingly, the possibility of error occurrence in displacement information can be reduced according to conditions during operation of the encoder. Moreover, the latest readable time is determined by containing the $t_R$ needed for reading the encoder signal, and thus the correct latest readable time can be calculated. Further, optimal processing in accordance with conditions can be performed by making the reading order of encoder signals decidable during signal processing by the signal generator 2012.

In step S204 in FIG. 5, the reading order of encoder signals is decided for all encoder heads. In contrast, only the encoder head from which the next encoder signal is read may be decided. In such a case, the encoder head whose latest readable time is the earliest is set as the encoder head from which the next encoder signal is read.

Figure 7:
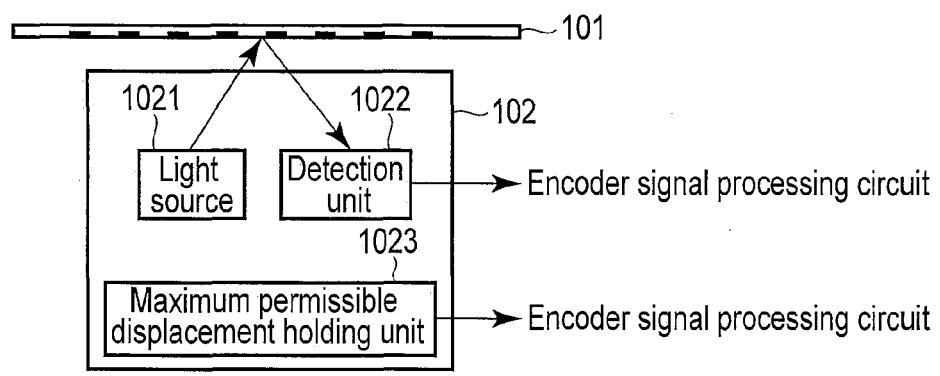
FIG. 7 is a diagram showing a modification in which a maximum permissible displacement holding unit is provided inside an encoder head.

In the above example in FIG. 4, the maximum permissible displacement holding unit 2022 is provided inside the encoder signal processing circuit 200. The maximum permissible displacement may be different, as described above, depending on the encoder head to be used, and thus, as shown in FIG. 7, a maximum permissible displacement holding unit 1023 may be provided inside the encoder head 102. If such a configuration is adopted, the configuration of the encoder signal processing circuit 200 can be simplified.

Figure 8:
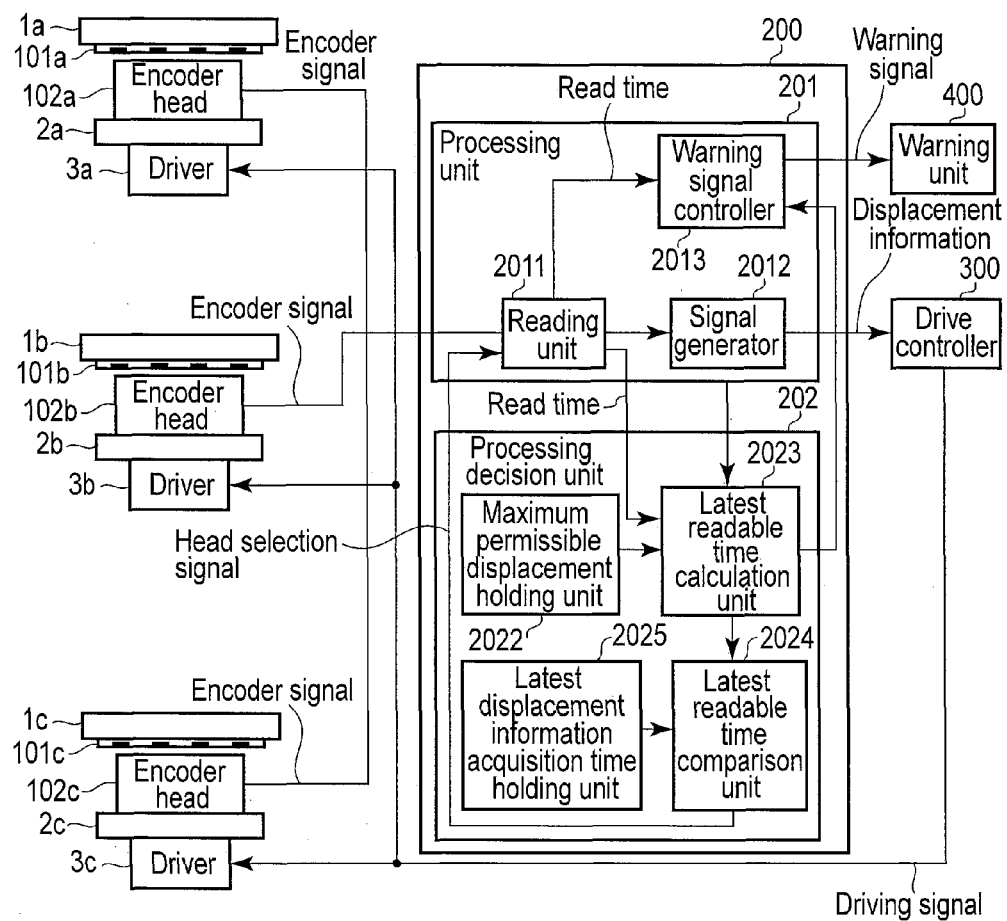
FIG. 8 is a diagram showing the configuration of an encoder system containing an encoder signal processing circuit according to a first modification of the second embodiment of the present invention.

Next, a modification of the second embodiment will be described. FIG. 8 is a diagram showing the configuration of an encoder system containing an encoder signal processing circuit according to a first modification of the second embodiment of the present invention. The first modification of the second embodiment is different from the second embodiment in that a processing decision unit 202 further includes a latest displacement information acquisition time holding unit 2025.

The latest displacement information acquisition time holding unit 2025 is a memory to hold the latest displacement information acquisition time for each encoder head. The latest displacement information acquisition time is the acquisition time of the latest displacement information that can be permitted to control each of drivers 3a, 3b, and 3c by a drive controller 300. If the reading interval of encoder signals (that is, the calculation interval of displacement information) exceeds the latest displacement information acquisition time, the control of the movable body corresponding thereto may be disrupted.

The operation of an encoder system in the present modification is based on the operation described with reference to FIG. 5. However, in step S204 in FIG. 5, a latest readable time comparison unit 2024 compares the latest readable time for each encoder head and the latest displacement information acquisition time for each encoder head to decide the reading order of encoder signals in chronological order. Naturally, only the earliest time may be determined.

In the first modification of the second embodiment described above, the reading order of encoder signals is decided by considering, in addition to the latest readable time, the latest displacement information acquisition time. Accordingly, in addition to being able to reduce the possibility of error occurrence in displacement information, the possibility of the control of the drive controller 300 being hindered can also be reduced.

In the example in FIG. 8, the latest displacement information acquisition time holding unit 2025 is provided inside an encoder signal processing circuit 200. However, the latest displacement information acquisition time holding unit 2025 may also be provided outside the encoder signal processing circuit 200; for example, inside the drive controller 300.

Next, a second modification of the second embodiment will be described with reference to FIGS. 9A and 9B. The configuration shown in FIG. 4 can be applied as the configuration of an encoder system. In the second embodiment described above, the reading order of encoder signals is decided. In the present modification, by contrast, in addition to the reading order, the reading interval is changed. If it is assumed that the speed of each movable body does not change, the encoder head whose latest readable time is first determined to be the earliest is likely to be determined also thereafter that the latest readable time thereof is the earliest. In the present modification, in consideration of the above, the reading interval of encoder signals from an encoder head whose latest readable time is earlier is shortened and the reading interval of encoder signals from an encoder head whose latest readable time is later is prolonged.

Figure 9A:
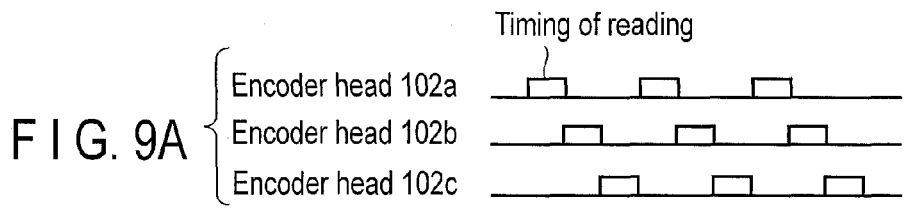
FIG. 9A is a diagram illustrating an encoder signal processing circuit according to a second modification of the second embodiment of the present invention and is a timing chart when encoder signals are read in the order of encoder heads 102a, 102b, 102c having the same latest readable time.
Figure 9B:
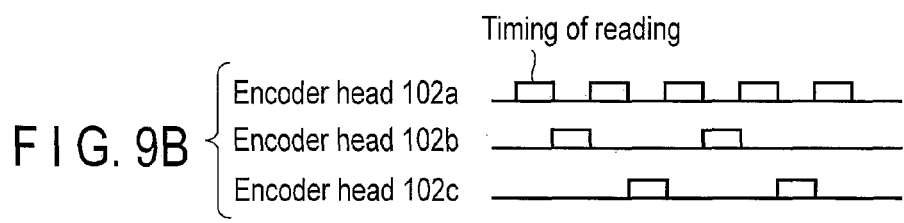
FIG. 9B is a diagram illustrating the encoder signal processing circuit according to the second modification of the second embodiment of the present invention and is a timing chart when the latest readable time of the encoder head 102a is the earliest.

For example, FIG. 9A is a timing chart when the latest readable times corresponding to encoder heads 102a, 102b, and 102c are the same and encoder signals are read in the order of the encoder heads 102a, 102b, and 102c. In this case, the equal reading interval of respective encoder signals of the encoder heads 102a, 102b, and 102c is set. On the other hand, FIG. 9B is a timing chart when the latest readable time of the encoder head 102a is the earliest. In this case, the reading interval of encoder signals of the encoder head 102a is made shorter than the reading interval of respective encoder signals of the encoder heads 102b, 102c.

In the second modification of the second embodiment described above, the reading interval of encoder signals is changed in accordance with the latest readable time. Accordingly, by merely calculating the latest readable time once and deciding the reading order, the possibility of an error occurrence of displacement information can be reduced thereafter as long as the speed of a movable body does not become faster than the speed when the reading interval is decided.

[Third Embodiment]

Figure 10:
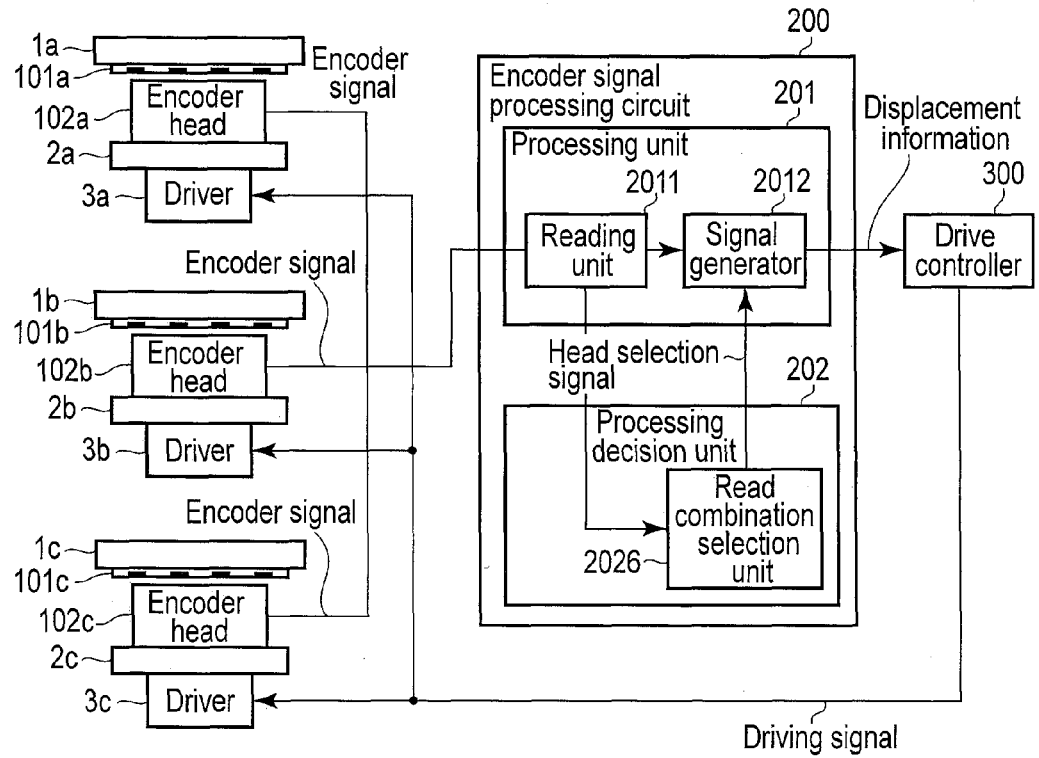
FIG. 10 is a diagram showing the configuration of an encoder system containing an encoder signal processing circuit according to a third embodiment of the present invention.

Next, the third embodiment of the present invention will be described. FIG. 10 is a diagram showing the configuration of an encoder system containing an encoder signal processing circuit according to the third embodiment of the present invention. In the first and second embodiments described above, the content of processing concerning reading of an encoder signal from an encoder head is changed. In the third embodiment, by contrast, the content of processing for an encoder signal read by a reading unit 2011 is changed. In the third embodiment, as shown in FIG. 10, a processing content selection unit 2026 is provided. In FIG. 10, a read combination selection unit 2021 shown in the first embodiment or a maximum permissible displacement holding unit 2022, a latest readable time calculation unit 2023, or a latest readable time comparison unit 2024 shown in the second embodiment may be provided.

Different portions from the first embodiment will be described below. The reading unit 2011 in the present embodiment reads encoder signals from encoder heads in a preset order and outputs the encoder signals to a signal generator 2012 and the processing content selection unit 2026. The processing content selection unit 2026 generates a processing selection signal according to encoder signals from the reading unit 2011 and inputs the processing selection signal into the signal generator 2012. Details of the processing content selection unit 2026 will be described later.

Figure 11:
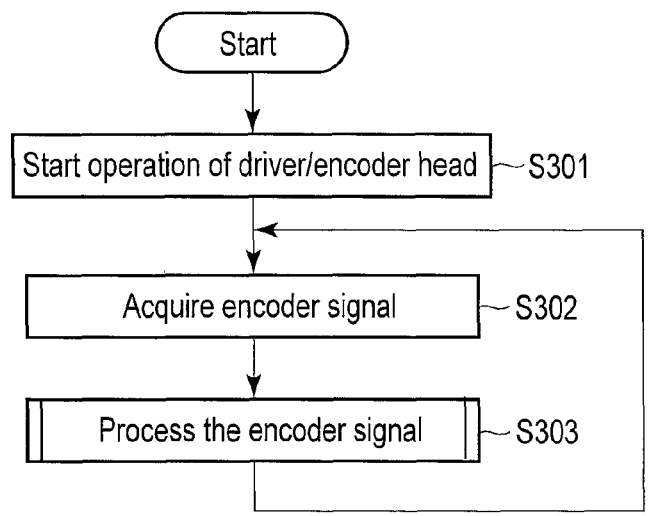
FIG. 11 is a flow chart showing the flow of operation of the encoder system in the third embodiment of the present invention.

The operation of an encoder system in the present embodiment will be described below. FIG. 11 is a flow chart showing the flow of operation of the encoder system in the third embodiment.

In FIG. 11, a drive controller 300 supplies a driving signal to each of drivers 3a, 3b, and 3c to start the operation of the drivers. The drive controller 300 also turns on power supplies of encoder heads (step S301). After the operation of the drivers and encoder heads is started, the reading unit 2011 reads an encoder signal from one of encoder heads 102a, 102b, and 102c according to a predetermined order, converts the encoder signal into a digital signal, and outputs the encoder signal converted into the digital signal to the signal generator 2012 and the processing content selection unit 2026 (step S302). The reading order of encoder signals in step S302 is assumed to be, for example, the order of the encoder heads 102a, 102b, and 102c. Encoder signals from respective encoder heads may be read at the same time. In such a case, respective read encoder signals are held in the reading unit 2011.

Upon receipt of input of the encoder signal, the signal generator 2012 processes the input encoder signal to start the calculation of displacement information (step S303). At this point, the signal generator 2012 performs processing in accordance with a processing selection signal from the processing content selection unit 2026. After step S303, the processing proceeds to step S302.

Figure 12:
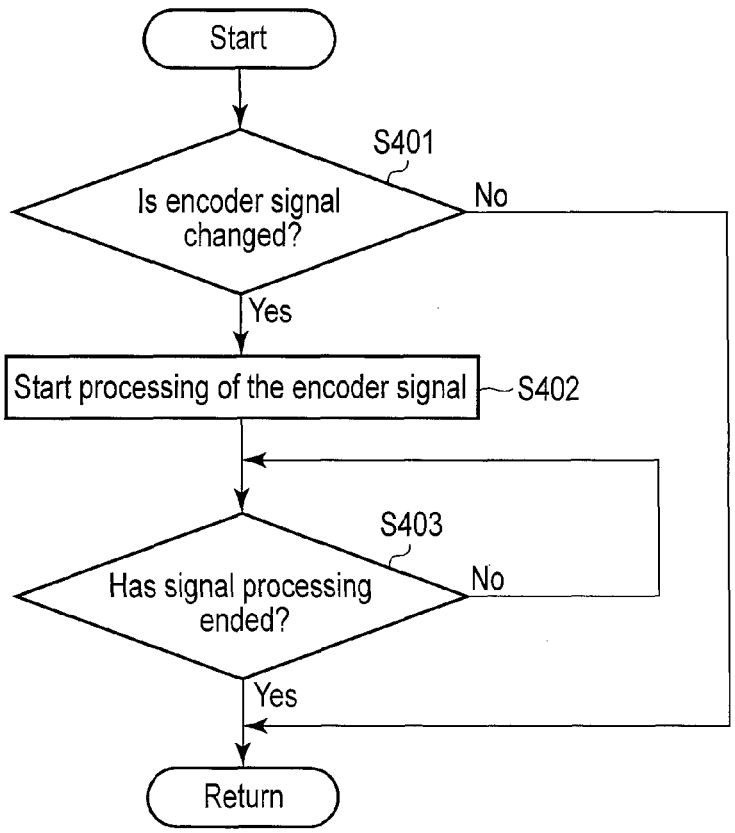
FIG. 12 is a flow chart showing an example of processing of an encoder signal in the third embodiment of the present invention.

FIG. 12 is a flow chart showing an example of processing of an encoder signal in the third embodiment. FIG. 12 shows an example in which signal processing of an encoder signal read by the reading unit 2011 whose value changes is preferentially performed. In FIG. 12, the processing content selection unit 2026 temporarily holds an encoder signal input from the reading unit 2011. After holding the encoder signal, the processing content selection unit 2026 determines whether the value (actually, an AD converted value corresponding to the amplitude) of the encoder signal held this time has changed from the value of an encoder signal read last time and held from the same encoder head as the encoder signal from which the encoder signal this time is read by a predetermined value or more (step S401). If, in step S401, the processing content selection unit 2026 determines that the value of the encoder signal this time has changed from the value of the last encoder signal by the predetermined value or more, signal processing on the encoder signal is continued. In this case, the processing content selection unit 2026 inputs a processing selection signal instructing to perform signal processing on the encoder signal held this time in the reading unit 2011 into the signal generator 2012 (step S402). The signal processing is, for example, calculation processing of displacement information.

After signal processing is started, the drive controller 300 determines whether the signal processing has ended, that is, whether displacement information is input from the signal generator 2012 (step S403). The drive controller 300 continues the determination in step S403 until the signal processing is determined to have ended in step S403. If, in step S401, the value of the encoder signal this time is determined not to have changed from the value of the last encoder signal by the predetermined value or more, or the signal processing is determined to have ended in the determination in step S403, the processing in FIG. 12 ends before returning to the processing in FIG. 11.

According to the present embodiment, as described above, an encoder signal whose value changes is preferentially processed, and thus encoder signals from a plurality of encoder heads can efficiently be processed in accordance with conditions during operation of the encoders.

In the example in FIG. 12, among encoder signals from a plurality of encoder heads, encoder signals whose values change are preferentially processed. In contrast, determining of the encoder signal which is preferentially processed in accordance with a difference between the value of the encoder signal this time and the value of the last encoder signal, that is, change in relative speed.

Even if the value of the encoder signal does not change by a predetermined value or more, various kinds of signal processing may be performed at any time.

Figure 13:
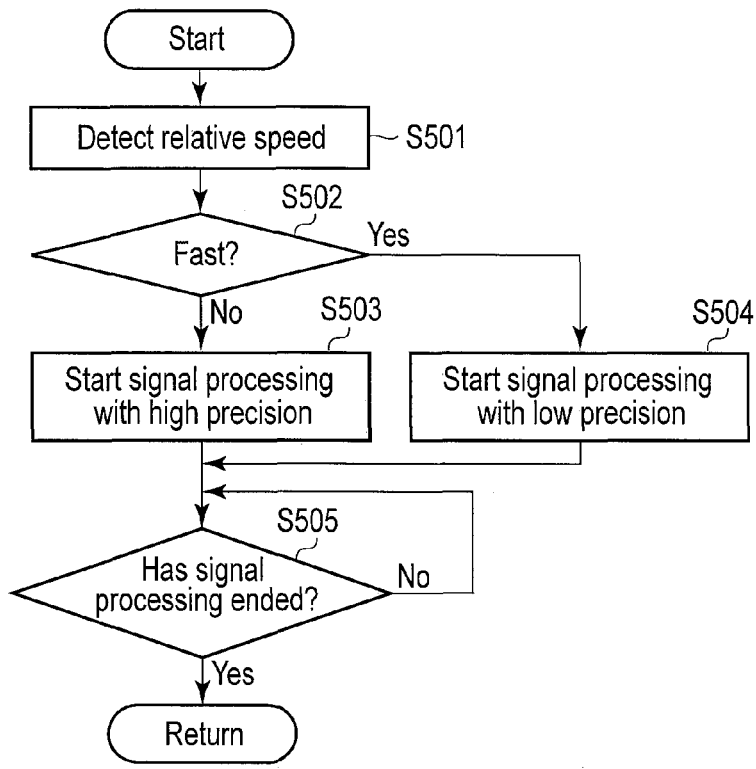
FIG. 13 is a flow chart showing a modification in which the encoder signal processed preferentially in accordance with changes in relative speed is switched.

In the present embodiment, the detection precision can be changed through an understanding of the external and internal properties of each of a plurality of encoder heads. FIG. 13 is a flow chart showing a modification in which the encoder signal processed preferentially in accordance with changes in relative speed is processed. The processing in FIG. 13 is performed in place of the processing in FIG. 12. In FIG. 13, a processing content selection unit 2026 temporarily holds an encoder signal input from a reading unit 2011. After holding the encoder signal, the processing content selection unit 2026 calculates changes in time of the value (AD converted value) of the encoder signal as a relative speed of a movable body (encoder head) (step S501). Subsequently, the processing content selection unit 2026 determines whether the calculated relative speed is faster than a predetermined speed (step S502). If, in step S502, the relative speed is determined, for example, to be faster than the predetermined speed, the processing content selection unit 2026 inputs a processing selection signal into a signal generator 2012 so that signal processing with low precision (low resolution processing) is performed on an encoder signal corresponding to a movable body (encoder head) faster than the predetermined speed if high precision (high resolution processing) is not needed (step S503). The signal processing with low precision means that the number of times of signal processing on encoder signals from a encoder head whose relative speed is determined, for example, to be fast is reduced when compared with the number of times of signal processing on encoder signals from other encoder heads. On the other hand, if, in step S502, the relative speed is not determined to be faster than the predetermined speed, the processing content selection unit 2026 inputs a processing selection signal into the signal generator 2012 so that signal processing with high precision is performed on encoder signals (step S504). The signal processing with high precision means that the number of times of signal processing on encoder signals from a encoder head whose relative speed is determined, for example, to be low is increased when compared with the number of times of signal processing on encoder signals from other encoder heads. Here, only the precision (resolution) of processing in accordance with the relative speed needs to be selected, the above is only an example, and processing may not be changed when the precision is fixed.

After signal processing is started, a drive controller 300 determines whether the signal processing has ended, that is, whether displacement information is input from the signal generator 2012 (step S505). The drive controller 300 continues the determination in step S505 until the signal processing is determined to have ended in step S505. When the drive controller 300 determines that the signal processing has ended in step S505, the processing in FIG. 13 ends before returning to the processing in FIG. 11.

Figure 14:
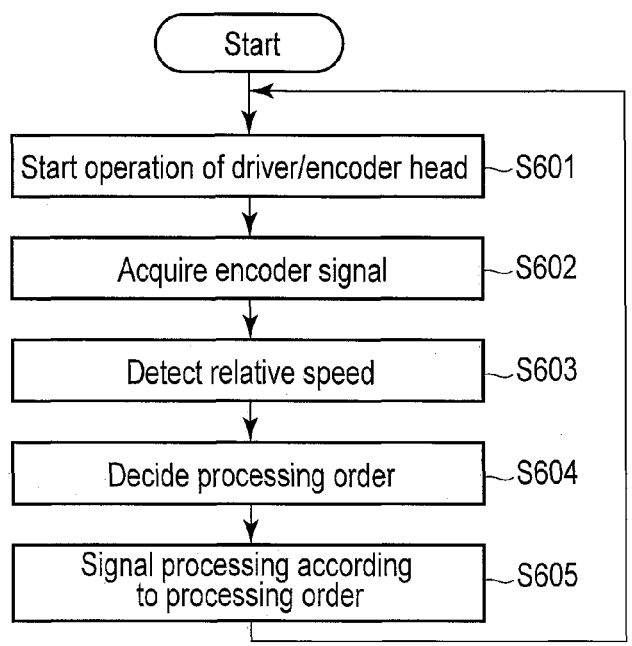
FIG. 14 is a flow chart showing another modification when the encoder signal processed preferentially in accordance with changes in relative speed is switched.

FIG. 14 is a flow chart showing the operation of another modification when signal processing in accordance with changes in relative speed is performed. The processing in FIG. 14 is performed in place of the processing in FIG. 11. In FIG. 14, a drive controller 300 supplies a driving signal to drivers 3a, 3b, and 3c to start the operation of the drivers. The drive controller 300 also turns on power supplies of encoder heads (step S601).

After the operation of the drivers and encoder heads is started, a reading unit 2011 reads an encoder signal from one of encoder heads 102a, 102b, and 102c in predetermined order, converts the encoder signal into a digital signal, and outputs the encoder signal converted into the digital signals to a signal generator 2012 and a processing content selection unit 2026 (step S602). The processing content selection unit 2026 temporarily holds the encoder signal input from the reading unit 2011. After holding the encoder signal, the processing content selection unit 2026 calculates the relative speed of the movable body (encoder head) (step S603). Subsequently, the processing content selection unit 2026 decides the signal processing order by comparing the calculated relative speed with relative speeds calculated based on encoder signals from other encoder heads (step S604). In this processing, the order is decided so that signal processing is performed in descending order of relative speed. After the signal processing order is decided, the processing content selection unit 2026 inputs a processing selection signal into the signal generator 2012 so that signal processing is performed in the signal processing order. The signal generator 2012 performs signal processing on encoder signals according to the input signal processing order (S605). The signal processing here is, for example, the calculation of displacement information.

By preferentially processing an encoder signal from an encoder head with a large relative displacement, as shown in the above modification, the precision of displacement information can be improved while enhancing efficiency of signal processing by the single encoder signal processing circuit 200.

If the order of priority of processing of encoder signals is preset, the processing order of encoder signals and the number of times of processing may be decided according to the order of priority. FIG. 15 is a diagram showing such a modification. The example in FIG. 15 is an example in which two encoder signals A, B are processed at the same time and the encoder signal A has a higher order of priority than the encoder signal B. In the example in FIG. 15, the order of priority and the number of times of processing of encoder signals are associated and signal processing of each encoder signal is performed as many times as the number of times of processing associated with the order of priority. The example in FIG. 15 shows an example in which the ratio of the numbers of times of processing of the encoder signal A and the encoder signal B is 2:1.

When the order of priority is preset, if an encoder signal having a higher order of priority is input during processing of an encoder signal, it is desirable to temporarily stop the current processing of the encoder signal to process the encoder signal having a higher order of priority. In this case, when the processing of the encoder signal having a higher order of priority is completed, the processing of the encoder signal whose processing has been stopped is restarted.

The present invention has been described based on the embodiments, but the present invention is not limited to the above embodiments and various modifications and applications can naturally be made without deviating from the scope of the present invention. For example, the user may be enabled to manually set the combination of encoder heads or signal processing content shown in the first to third embodiments. A modification in such a case is shown in FIG. 16. In FIG. 16, a processing decision signal input unit 500 is provided. By operating the processing decision signal input unit 500, the user can specify content of the setting of the combination of encoder heads or content of the setting of signal processing content to the processing decision unit 202.

If a processing content information holding unit 2027 that holds information about encoder heads to be used, information of the order of priority of signal processing and the like is provided in, for example, the processing decision unit 202, the combination of encoder heads and signal processing content can be set during initial settings immediately after power-on of the encoder signal processing circuit 200.

Further, the above embodiments include inventions at various stages and various inventions can be extracted by appropriately combining a plurality of disclosed features. For example, if the problem described above can also be solved by deleting some features from all features shown in an embodiment and effects as described above can be obtained, the configuration obtained by deleting certain features can also be extracted as an invention.

What is claimed is:

1. An encoder signal processing circuit, connected to encoder heads outputting an encoder signal in accordance with a relative displacement with respect to a corresponding scale in such a way that signals can be transmitted to and received from the encoder heads, which processes encoder signals from the encoder heads, the circuit comprising:
   a processing unit that generates displacement information from the encoder signal; and
   a processing decision unit that decides at least one of content of processing for the encoder heads and content of processing on encoder signals read from the encoder heads after starting to read an encoder signal from one of the encoder heads;
   wherein the processing for the encoder head is the processing in which the processing decision unit selects from among the encoder heads or changes the encoder head from which an encoder signal is next read,
   the encoder signals are periodic signals,
   the encoder heads are unable to detect a position if the encoder signal exceeds a fixed period between two continuous read times,
   the encoder signal processing circuit further comprises a maximum permissible displacement holding unit that holds a maximum permissible displacement indicating a limit value of the relative displacement permitted between the two continuous read times of the encoder signal for each of the encoder heads, and
   the processing decision unit calculates a latest readable time as a latest read time of the encoder signal for each of the encoder heads while maintaining signal processing of each of the encoder heads in the processing unit by using the maximum permissible displacement corresponding to each of the encoder heads and compares the latest readable times calculated for each of the encoder heads to decide, from among the encoder heads, the encoder head from which the encoder signal is next read.

2. The encoder signal processing circuit according to claim 1, wherein the processing decision unit decides the encoder head from which the encoder signal is next read from among the encoder heads by comparing a latest displacement information acquisition time as a latest readable time of the encoder signal permitted under control of drivers that relatively displace the scale and the encoder head corresponding to each other and the latest readable time.

3. The encoder signal processing circuit according to claim 1, wherein the processing decision unit calculates the latest readable time by including relative displacements at the different read time corresponding to each of the encoder heads and the read time of the encoder signal corresponding to each of the encoder heads.

4. The encoder signal processing circuit according to claim 1, wherein the processing decision unit makes a reading interval of the encoder signal from the encoder head having the earliest latest readable time shorter than the reading interval of the encoder signal from the encoder heads.

5. An encoder signal processing circuit, connected to encoder heads outputting an encoder signal in accordance with a relative displacement with respect to a corresponding scale in such a way that signals can be transmitted to and received from the encoder heads, which processes encoder signals from the encoder heads, the circuit comprising:
   a processing unit that generates displacement information from the encoder signal; and a processing decision unit that decides at least one of content of processing for the encoder heads and content of processing on encoder signals read from the encoder heads after starting to read an encoder signal from one of the encoder heads;

wherein the processing for the encoder head is the processing in which the processing decision unit selects from among the encoder heads or changes the encoder head from which an encoder signal is next read, at least one of the encoder heads includes a maximum permissible displacement holding unit that holds a maximum permissible displacement indicating a limit value of the relative displacement permitted in an interval of reading the two continuous encoder signals, and the processing decision unit calculates a latest readable time as a latest read time of the encoder signal for each of the encoder heads while maintaining signal processing of each of the encoder heads in the processing unit by using the maximum permissible displacement corresponding to each of the encoder heads and compares the latest readable times calculated for each of the encoder heads to decide, from among the encoder heads, the encoder head from which the encoder signal is next read.

6. The encoder signal processing circuit according to claim 5, wherein the processing decision unit decides the encoder head from which the encoder signal is next read from among the encoder heads by comparing a latest displacement information acquisition time as a latest readable time of the encoder signal permitted under control of drivers that relatively displace the scale and the encoder head corresponding to each other and the latest readable time.

7. The encoder signal processing circuit according to claim 5, wherein the processing decision unit calculates the latest readable time by including relative displacements at the different read time corresponding to each of the encoder heads and the read time of the encoder signal corresponding to each of the encoder heads.

8. The encoder signal processing circuit according to claim 5, wherein the processing decision unit makes a reading interval of the encoder signal from the encoder head having the earliest latest readable time shorter than the reading interval of the encoder signal from the encoder heads.

* * * * *